United States Patent [19]
Kasahara

[11] Patent Number: 5,869,856
[45] Date of Patent: Feb. 9, 1999

[54] FIELD EFFECT TRANSISTOR

[75] Inventor: Kensuke Kasahara, Tokyo, Japan

[73] Assignee: NEC Corporation, Tokyo, Japan

[21] Appl. No.: 772,925

[22] Filed: Dec. 24, 1996

[30] Foreign Application Priority Data

Dec. 25, 1995 [JP] Japan .................................. 7-336395

[51] Int. Cl.⁶ .......................... H01L 29/812; H01L 29/80
[52] U.S. Cl. .......................... 257/287; 257/192; 257/280
[58] Field of Search .................................. 257/154, 266, 257/358, 379, 380, 287, 278, 192, 194, 280

[56] References Cited

U.S. PATENT DOCUMENTS 5,293,058   3/1994   Tsividis .................................. 257/364

FOREIGN PATENT DOCUMENTS 53-114683   10/1978   Japan ................................... 257/379
60-258947   12/1985   Japan ................................... 257/379
62-248257   10/1987   Japan ................................... 257/379
6459961     3/1989    Japan .
3-286540    12/1991   Japan ................................... 257/194

OTHER PUBLICATIONS

P. Canfield et al.; "A p–Well GaAs MESFET Technology for Mixed–Mode Applications"; IEEE Journal of Solid–State Circuits, vol. 25, No. 6, Dec. 1990, pp. 1544–1548.

Primary Examiner—John F. Guay
Attorney, Agent, or Firm—Whitham, Curtis & Whitham

[57] ABSTRACT

Disclosed is a field effect transistor which has: an operating layer which is of a compound semiconductor; a first conductive layer which is formed as a channel layer; a second conductive layer which is formed below the first conductive layer and through which a current less than that flowing through the first conductive layer is flown; an ohmic electrode which is ohmic-junctioned with the second conductive layer; and a source electrode and a drain electrode which are junctioned with the first conductive layer; wherein the source electrode and the drain electrode are ohmic-junctioned with the ohmic electrode with a resistivity lower than the resistivity between the first conductive layer and the second conductive layer.

7 Claims, 3 Drawing Sheets

FIELD EFFECT TRANSISTOR

FIELD OF THE INVENTION

This invention relates to a field effect transistor, and more particularly to, a field effect transistor in which the operating layer(channel layer) is of a compound semiconductor.

BACKGROUND OF THE INVENTION

In such a field effect transistor, it is known that a transient variation in channel current occurs due to a variation of drain voltage. This phenomenon causes an unstable operation of device, for example, a frequency dispersion of drain conductance.

The above-mentioned transient variation is generally considered as a response at the deep level of a buffer layer or substrate, and a quantity and a time constant of the variation is dependent on the conductivity of buffer layer or substrate and the characteristic of the deep level.

Up to the present, to suppress such a transient variation, a conductive layer with an opposite conductive type to a channel layer is formed under the channel layer, and the conductive layer is short-circuited with a source or drain electrode to fix the potential(for example, Japanese patent application laid-open No.64-59961).

However, in the conventional field effect transistor, since the ohmic electrode contacted with the second conductive layer is short-circuited with the source or drain electrode, i.e., the device has an asymmetrical structure, the interchanging between the source electrode and the drain electrode causes the changing of characteristic. Thus, there rises a problem that it is difficult to design a circuit by employing such a field effect transistor.

SUMMARY OF THE INVENTION

Accordingly, it is an object of the invention to provide a field effect transistor in which the transient variation of the channel current can be sufficiently suppressed to make the circuit designing easier.

According to the invention, a field effect transistor, comprises;

an operating layer which is of a compound semiconductor;

a first conductive layer which is formed as a channel layer;

a second conductive layer which is formed below the first conductive layer and through which a current less than that flowing through the first conductive layer is flown;

an ohmic electrode which is ohmic-junctioned with the second conductive layer; and a source electrode and a drain electrode which are junctioned with the first conductive layer;

wherein the source electrode and the drain electrode are ohmic-junctioned with the ohmic electrode with a resistivity lower than the resistivity between the first conductive layer and the second conductive layer.

The principle of the invention will be explained below.

It is known that there occurs a response at a deep level of a substrate or a buffer layer or an interface between them and this response affects the channel current. To eliminate the affection to the channel current, it is necessary for a second conductive layer other than the channel to be formed between the channel layer and a layer with the deep level.

In this case, a DC(direct current)-like variation of potential $\Delta Vb_{DC}$ of the second conductive layer located under the channel is determined by the variation of drain voltage $\Delta Vd$ and a resistivity between the second conductive layer(active layer) and source and drain electrodes. The potential variation $\Delta Vb_{DC}$ is expressed by the next equation:

$$\Delta Vb_{DC}=\Delta Vd(1/R_{DN}/(1/R_{SD}+1/R_{SN}))$$

Further, a potential variation $\Delta Vb_{TRAN}$ of the second conductive layer which means the quantity of transient response is determined by a capacity between the second conductive layer(active layer) and source and drain electrodes. The potential variation $\Delta Vb_{TRAN}$ is expressed by the next equation;

$$\Delta Vb_{TRAN}=\Delta Vd(C_{DB}/(C_{DB}+C_{SB}))$$

From a conductance $Gm_B$ from the side of substrate and a drain voltage variation $\Delta Vd$, a current variation $\Delta Id$ of the channel is expressed by the next equation:

$$\Delta Id=Gm_B \cdot \Delta Vd=Gm_B(\Delta Vb_{TRAN}-\Delta Vb_{DC})$$

Accordingly, to eliminate the current variation $\Delta Id$, both $\Delta Vb_{TRAN}$ and $\Delta Vb_{DC}$ are to be zero or to have the same value.

In the invention, $\Delta Vb_{TRAN}$ and $\Delta Vb_{DC}$ are the same value. Namely, the field effect transistor is symmetrically structured to equalize the values of resistivity and capacity, whereby both $\Delta Vb_{TRAN}$ and $\Delta Vb_{DC}$ are $\Delta Vd/2$. Thus, the current variation $\Delta Id$ to the drain voltage variation $\Delta Vd$ can be zero.

Meanwhile, in this structure, since the second conductive layer is, as described hereafter, formed under the first conductive layer as a channel layer, it is necessary for the current flowing through the second conductive layer to be sufficiently small as compared to the current flowing through the channel layer.

Furthermore, to control the potential of the second conductive layer to be $\Delta Vd/2$, it is necessary for the second conductive layer to be ohmic-contacted with source and drain electrodes to give a resistivity lower than the resistivity between the channel layer and the second conductive layer.

To satisfy the above two requirements, it is effective for enhancing the resistivity between the channel layer and the second conductive layer that a hetero-barrier(heterojunction barrier) is formed between the first conductive layer as a channel layer and the second conductive layer.

As a result, the resistivity between the second conductive layer and the source and drain electrodes can be set to be high, and the current flowing through the second conductive layer can be therefore suppressed to be small.

If both the first and second conductive layers are of the same conductive type, the source and drain electrodes can be, as described hereafter, formed by using the same ohmic electrode through the hetero-junction barrier.

On the other hand, if the first and second conductive layers are of different conductive types, by providing the second conductive layer with another ohmic-junction electrode different from the source and drain electrodes Formed on the first conductive layer and short-circuiting between this ohmic-junction electrode and the source and drain electrodes formed on the first conductive layer, the current flowing through the second conductive layer can be suppressed to be small.

Furthermore, even when the first and second conductive layers are of different conductive types, by etching until the second conductive layer appears on the surface and forming an ohmic-junction electrode which is the same as the source and drain electrodes formed on the first conductive layer on both the first and second conductive layers, the current flowing through the second conductive layer can be also suppressed to be small.

DESCRIPTION OF THE DRAWINGS

The invention will be explained in more detail in conjunction with the appended drawings, wherein.

DESCRIPTION OF THE PREFERRED EMBODIMENTS

Before explaining a field effect transistor in the preferred embodiment, the aforementioned conventional field effect transistor will be explained in FIG. 1.

Figure 1:
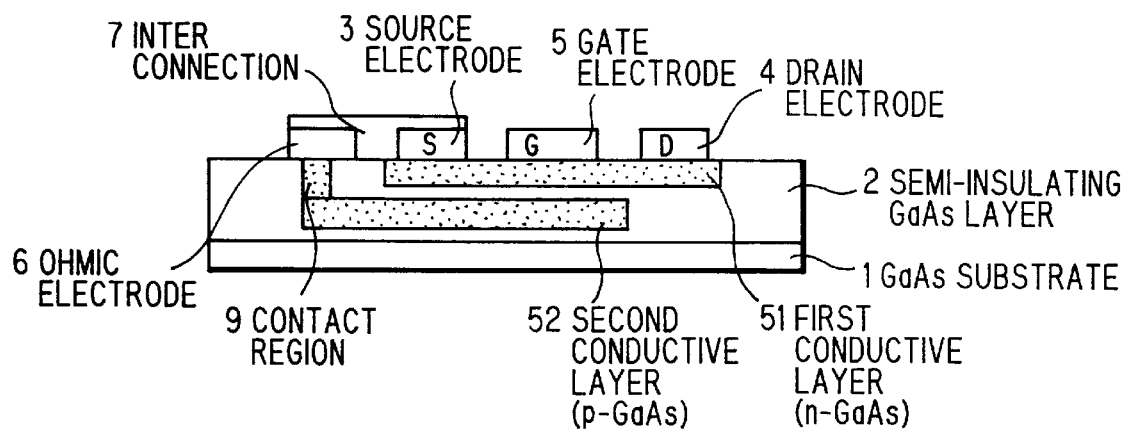
FIG. 1 is a cross sectional view showing a conventional field effect transistor.

As shown in FIG. 1, in a semi-insulating GaAs layer 2 which is formed on a GaAs substrate 1, a n-channel layer (first conductive layer) 51 is formed and, under the first conductive layer 51, a second conductive layer 52 is formed. The second conductive layer 52 is contacted through d contact region(p-type) 9 with an ohmic electrode 6. Further, a source electrode 3 and a drain electrode 4 which are ohmic-contacted with the first conductive layer 51 as well as a gate electrode 5 are formed. Herein, the ohmic electrode 6 is short-circuited with the source electrode 3 by an electrode (interconnection) 7.

Figure 2:
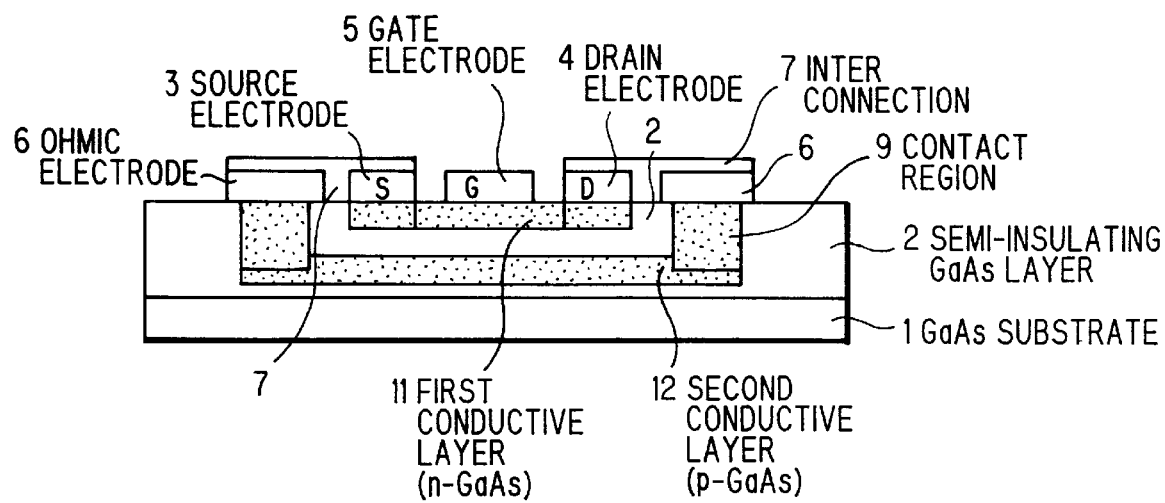
FIG. 2 is a cross sectional view showing a field effect transistor in a first preferred embodiment according to the invention.

Next, a field effect transistor in the first preferred embodiment will be explained in FIG. 2, wherein like parts are indicated by like reference numerals as used in FIG. 1.

In a semi-insulating GaAs layer 2 formed on a GaAs substrate 1, a p-GaAs layer is formed as a second conductive layer 12, for example, by ion implanting Mg. Further, for example, by ion implanting Mg, a contact region(p-type) 9 is formed from on the second conductive layer 12.

Then, for example, by ion implanting Si, a n-GaAs layer 11 as a first conductive layer is formed over the second conductive layer 12. By annealing, these ion-implanted layers, i.e., the first and second conductive layers, are activated, and, thereafter, for example, by using AuGe/Ni/Au, a source electrode 3 and a drain electrode 4 which are ohmic-junctioned with the first conductive layer 11, and, by using Ti/Pt/Au, a gate electrode 5 to control the carrier concentration in the first conductive layer 11 is formed.

Further, an electrode(ohmic electrode) 6 which is ohmic-junctioned with the contact region 9 of the second conductive layer 12 is formed. Herein, since the ohmic electrode 6 is formed using AuZn/Au, the ohmic junction has a resistivity lower than the resistivity between the first and second conductive layers.

Then, the ohmic electrode 6 is short-circuited through an electrode(interconnection) 7, which is formed using, for example, Ti/Au), with the source electrode 3 and the drain electrode 4, thereby obtaining a field effect transistor.

In the field effect transistor shown in FIG. 1, just below the gate, the first and second conductive layers 11, 12 are insulated from each other by the p-n junction. Since the source electrode 3 and drain electrode 4 are ohmic-junctioned with the p-type second conductive layer 12 at their ends, it is structured to be symmetrical in both resistivity and capacity.

Accordingly, in the field effect transistor shown in FIG. 1, to the variation $\Delta Vd$ of source-drain voltage, the DC-like potential variation of the second conductive layer 12 below the gate becomes $\Delta Vd/2$. Furthermore, by the symmetry in the area and shape of device, the capacity becomes equal at both ends of the source and drain electrodes. Thus, the transient variation also becomes $\Delta Vd/2$. Meanwhile, the final variation of source-drain voltage is equal to the difference between the DC-like variation and the transient variation. In this case, since both the variations are $\Delta Vd/2$, the final variation of source-drain voltage becomes zero. Namely, as described above, by forming the second conductive layer 12, the affection to the channel current by the deep level etc. in the substrate which accompanies to the source-drain voltage variation $\Delta Vd$ can be suppressed. Moreover, the voltage variation of the second conductive layer 12 can be kept to be zero since the device structure is symmetrical. In addition, the circuit can be easily designed since the device is symmetrical.

However, since it is difficult to control the current flowing through the second conductive layer 12 by the gate voltage, it is necessary for the current flowing the second conductive layer 12 to be controlled to be negligible as compared to the current flowing through the first conductive layer. 11. In this regard, the carrier concentration and resistivity of the second conductive layer 12 may be controlled.

Though, in this embodiment, both the first and second conductive layers 11, 12 are formed by ion implanting, they may be formed as epitaxial layers by using the MOCVD method or the like and the isolation may be conducted by ion implanting. Also, while the electrode materials described above are given as an example, another electrode materials may be used.

A field effect transistor in the second preferred embodiment will be explained in FIG. 3, wherein like parts are indicated by like reference numerals as used in FIGS. 1 and 2.

On a semi-insulating GaAs substrate 1, a non-doped GaAs layer 2 is grown by using, for example, the MOCVD method. Then, a p-GaAs conductive layer is grown as a second conductive layer 22. Further, a AlGaAs layer 8 as a barrier is grown, and thereafter a n-GaAs layer is formed as a first conductive layer 21. Then, the region between the devices(between the layers) is insulated by ion implanting oxygen etc.

Thereafter, a source electrode 3 and a drain electrode 4 which are ohmic-junctioned with the first conductive layer 21 are formed, and a gate electrode 5 to control the carrier concentration of the first conductive layer 21 is further formed.

Further, an electrode 6 ohmic-junctioned with a contact region(p-type) 9 of the second conductive layer 22 is formed, and the electrode 6 and the source and drain electrodes 3, 4 are short-circuited by using an electrode 7, thereby obtaining a field effect transistor.

Herein, with a resistivity lower than the resistivity between the first conductive layer 21 of n-GaAs layer and the second conductive layer 22 of low-concentration p-GaAs layer, the ohmic electrode 6 and the source and drain electrodes 3, 4 are short-circuited. Because of this, the same effect as the field effect transistor shown in FIG. 2 can be obtained.

Figure 3:
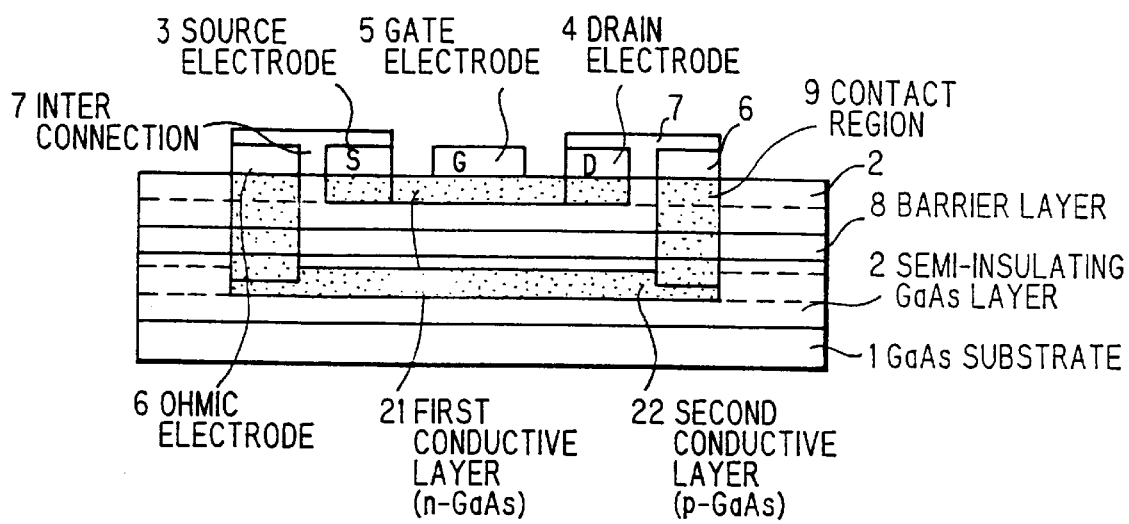
FIG. 3 is a cross sectional view showing a field effect transistor in a second preferred embodiment according to the invention.

In the field effect transistor shown in FIG. 3, the AlGaAs layer 8 as a barrier layer is formed between the first and second electrodes 21, 22. By this barrier layer, the resistivity between the first and second conductive layers 21, 22 can be kept to be high. Thus, since the resistivity therebetween can be kept to be high, the current flowing through the second conductive layer 22 can be suppressed to be steadily small.

Though, in this embodiment, both the first and second conductive layers 21, 22 are formed as epitaxial layers by using the MOCVD method, they may be formed by ion implanting similarly to the first embodiment.

Figure 4:
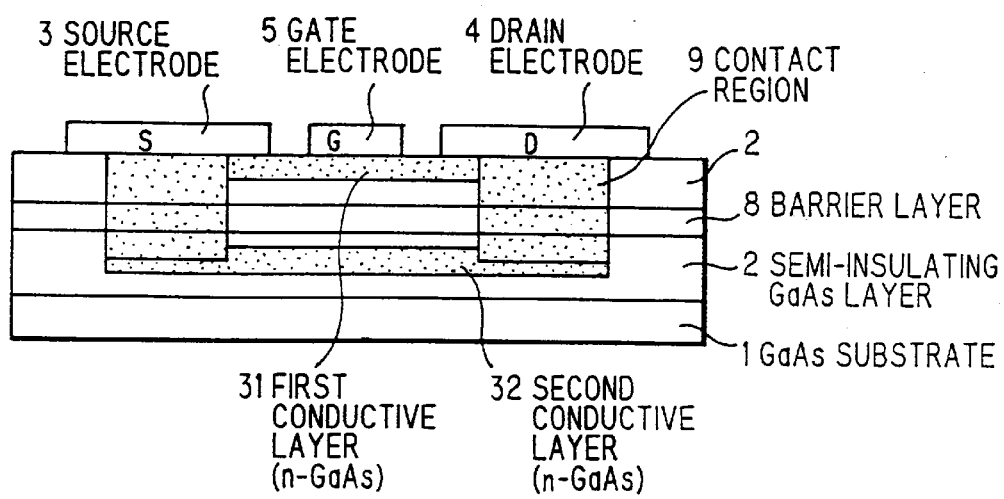
FIG. 4 is a cross sectional view showing a field effect transistor in a third preferred embodiment according to the invention.

A field effect transistor in the third preferred embodiment will be explained in FIG. 4, where a n-GaAs layer is used as a second conductive layer. In FIG. 4, the second conductive layer is indicated by 32 and a first conductive layer of a n-GaAs layer is indicated by 31.

In the third embodiment, since the n-GaAs layer is used as the second conductive layer 32(a contact region is also of n-type), i.e., the first and second conductive layers 31, 32 are of the same conductivity type, the source and drain electrodes 3, 4 of the first conductive layer 31 can be also used as an electrode to be ohmic-junctioned with the second conductive layer 32. Namely, the source and drain electrodes 3, 4 are in common junctioned with the first and second conductive layers 31, 32.

As a result, in the field effect transistor shown in FIG. 4, the fabrication steps can be shortened and, further, the current value at the second conductive layer 32 can be designed to be small since the two conductive layers are insulated by the barrier layer(hetero-barrier) 8. Furthermore, by using the n-type second conductive layer, the high-frequency characteristic can be improved.

A field effect transistor in the fourth preferred embodiment will be explained in FIG. 5, where first and second conductive layers are indicated by 41, 42, respectively.

In the fourth embodiment, when an ohmic electrode 6 is formed on the second conductive layer 42, the second conductive layer 42 is first exposed on the surface by mesa-etching, and the ohmic electrode 6 is then formed on the second conductive layer 42, and, simultaneously, the source and drain electrodes 3, 4 of the first conductive layer 41 are short-circuited with the ohmic electrode 6, thereby obtaining a field effect transistor.

Figure 5:
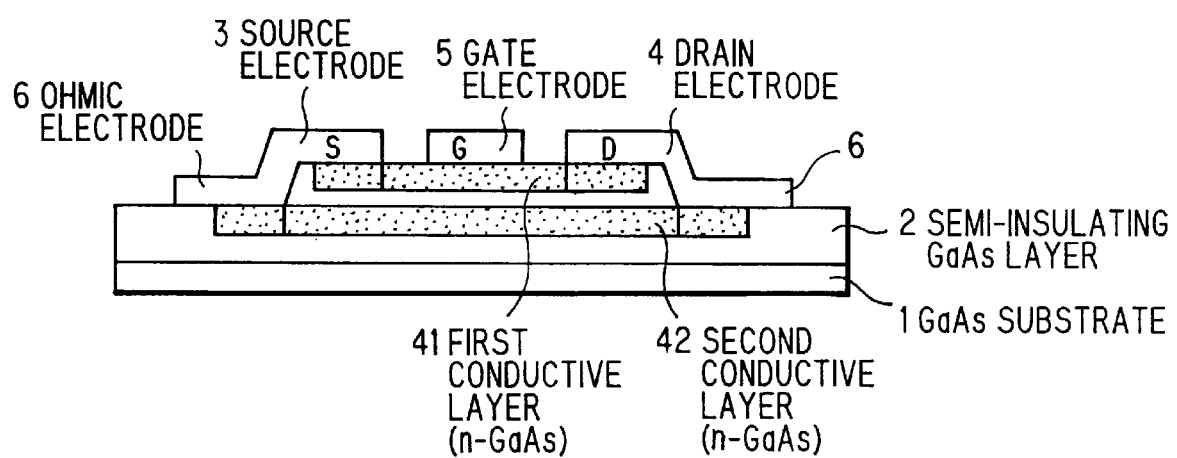
FIG. 5 is a cross sectional view showing a field effect transistor in a fourth preferred embodiment according to the invention.

As a result, in the field effect transistor shown in FIG. 5, it is easy to provide the ohmic contact and the device can be easily fabricated. Also, the field effect transistor in this embodiment can get the same effect as the field effect transistor shown in FIG. 2.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A field effect transistor, comprising:
    a first conductive layer comprising a channel for carrying a first current;
    a second conductive layer, formed below said first conductive layer, through which a second current flows, said second current being less than said first current;
    first and second ohmic electrodes connecting to either end of said second conductive layer;
    a source electrode and a drain electrode connected to said first conductive layer;
    wherein said source electrode and said drain electrode are connected to said first and second ohmic electrodes, respectively with a resistance lower than a resistance between said first conductive layer and said second conductive layer, and
    a semiconductor layer between said first conductive layer and said second conductive layer, said semiconductor layer having an electron affinity smaller than electron affinities of said first conductive layer and said second conductive layer.

2. A field effect transistor according to claim 1, wherein said first conductive layer and said second conductive layer comprise a same conductivity type, and said source electrode and said drain electrode comprise said ohmic electrodes.

3. A field effect transistor, comprising:
    a first conductive layer comprising a channel for carrying a first current;
    a second conductive layer, formed below said first conductive layer, through which a second current flows, said second current being less than said first current;
    first and second ohmic electrodes connecting to either end of said second conductive layer;
    a source electrode and a drain electrode connected to said first conductive layer;
    wherein said source electrode and said drain electrode are connected to said first and second ohmic electrodes, respectively with a resistance lower than a resistance between said first conductive layer and said second conductive layer,
    wherein said first conductive layer and said second conductive layer comprise a same conductivity type, and said source electrode comprises a first ohmic electrode and said drain electrode comprises a second ohmic electrode and said first conductive layer is etched until said second conductive layer is exposed.

4. A symmetrical field effect transistor (FET) having suppressed transient current variations, comprising:
    a first conductive layer near a surface of a substrate for carrying a channel current between a drain electrode and source electrode beneath a gate electrode, said gate electrode for controlling a resistance of said first conductive layer;
    a second conductive layer buried in said substrate running parallel beneath said first conducive layer; and
    means for electrically connecting said source electrode and said drain electrode to said first conductive layer and to said second conductive layer,
    wherein said second conductive layer has a high resistance as compared to said first conductive layer resulting in said second conductive layer carrying small current between said drain electrode and said source electrode to suppress transient current variations in said first conductive layer, and
    wherein said first conductive layer and said second conductive layer comprise a same semiconductor type.

5. A symmetrical field effect transistor (FET) having suppressed transient current variations, comprising:
    a first conductive layer near a surface of a substrate for carrying a channel current between a drain electrode and source electrode beneath a gate electrode, said gate electrode for controlling a resistance of said first conductive layer;

a second conductive layer buried in said substrate running parallel beneath said first conducive layer;

means for electrically connecting said source electrode and said drain electrode to said first conductive layer and to said second conductive layer, wherein said second conductive layer has a high resistance as compared to said first conductive layer resulting in said second conductive layer carrying small current between said drain electrode and said source electrode to suppress transient current variations in said first conductive layer, and a barrier layer between said first conductive layer and said second conductive layer.

6. A symmetrical field effect transistor (FET) having suppressed transient current variations, comprising:

a first conductive layer near a surface of a substrate for carrying a channel current between a drain electrode and source electrode beneath a gate electrode, said gate electrode for controlling a resistance of said first conductive layer;

a second conductive layer buried in said substrate running parallel beneath said first conducive layer;

means for electrically connecting said source electrode and said drain electrode to said first conductive layer and to said second conductive layer, wherein said second conductive layer has a high resistance as compared to said first conductive layer resulting in said second conductive layer carrying small current between said drain electrode and said source electrode to suppress transient current variations in said first conductive layer, and wherein said second conductive layer extends beyond said drain electrode and said source electrode, and wherein said substrate is removed to expose portions of said second conductive layer which extend beyond said drain electrode and said source electrode.

7. A symmetrical field effect transistor (FET) comprising dual conductive regions for suppressing transient current variations, comprising:

a first conductive region connected between a source electrode and a drain electrode having a conductance controlled by a voltage applied to a gate electrode; and a second conductive region connected between said source electrode and said drain electrode beneath said first conductive region, wherein said second conductive region has a high resistance to carry a small current between said drain electrode and said source electrode to suppress transient current variations in said first conductive layer, and wherein said first conductive region and said second conductive region comprise a same semiconductor type.

* * * * *